(12) United States Patent
Onodera et al.

(10) Patent No.: US 7,888,182 B2
(45) Date of Patent: Feb. 15, 2011

(54) ELECTRONIC COMPONENT, PRODUCTION METHOD OF ELECTRONIC COMPONENT, MOUNTED STRUCTURE OF ELECTRONIC COMPONENT, AND EVALUATION METHOD OF ELECTRONIC COMPONENT

(75) Inventors: Shinya Onodera, Nikaho (JP); Mikio Tsuruoka, Tokyo (JP)

(73) Assignee: TDK Corporation, Tokyo (JP)

( * ) Notice: Subject to any disclaimer, the term of this patent is extended or adjusted under 35 U.S.C. 154(b) by 774 days.

(21) Appl. No.: 11/715,345

(22) Filed: Mar. 8, 2007

(65) Prior Publication Data

US 2007/0228557 A1 Oct. 4, 2007

(30) Foreign Application Priority Data

Mar. 30, 2006 (JP) ............................. 2006-094034

(51) Int. Cl.
*H01L 21/00* (2006.01)

(52) U.S. Cl. ................................ 438/119; 257/E21.514

(58) Field of Classification Search .......... 257/E21.511, 257/734, E23.018, E23.166, E23.121, E21.514; 438/107, 119, 121
See application file for complete search history.

(56) References Cited

U.S. PATENT DOCUMENTS

| | | | | |
|---|---|---|---|---|
| 5,965,064 A * | 10/1999 | Yamada et al. | ............... | 252/512 |
| 6,327,134 B1 * | 12/2001 | Kuroda et al. | ................ | 361/303 |
| 6,512,184 B1 * | 1/2003 | Yamada et al. | ............... | 174/259 |
| 6,610,925 B1 * | 8/2003 | Wajima | ........................ | 174/535 |
| 6,690,558 B1 * | 2/2004 | Devoe et al. | ................... | 361/58 |
| 7,046,500 B2 * | 5/2006 | Lee et al. | ..................... | 361/303 |
| 2001/0001258 A1 * | 5/2001 | Ishigaki et al. | .............. | 361/502 |
| 2002/0160540 A1 * | 10/2002 | Kaida | ............................ | 438/1 |
| 2005/0006442 A1 * | 1/2005 | Stillabower | ............ | 228/180.22 |
| 2005/0098338 A1 * | 5/2005 | Kitae et al. | ................. | 174/52.1 |
| 2006/0033190 A1 * | 2/2006 | Kinsman et al. | ............ | 257/678 |

FOREIGN PATENT DOCUMENTS

| | | |
|---|---|---|
| JP | A 9-326326 | 12/1997 |
| JP | 10-170944 | 6/1998 |
| JP | 2002-093854 | 3/2002 |
| JP | 2004-165659 | 6/2004 |

* cited by examiner

*Primary Examiner*—Matthew C Landau
*Assistant Examiner*—Latanya Crawford
(74) *Attorney, Agent, or Firm*—Oliff & Berridge, PLC

(57) ABSTRACT

An electronic component having an element body having at least one plane, and a terminal electrode to be electrically connected through an electroconductive particle to a circuit substrate. The terminal electrode is formed on the plane of the element body. When the plane of the element body is defined as a reference plane, a ratio of a projected area onto the reference plane of an external surface of the terminal electrode opposed to the circuit substrate in a region where a height of the terminal electrode from the reference plane is not less than a value resulting from subtraction of a diameter of the electroconductive particle from a maximum of the height, to a projected area onto the reference plane of the external surface of the terminal electrode opposed to the circuit substrate is set to be not less than 10%.

1 Claim, 9 Drawing Sheets

Fig.7

| | Ra | Rq | Rt | Rz (JIS) |
|---|---|---|---|---|
| | | | | (μm) |
| MEASURED LOCATION 1 | 0.134 | 0.185 | 1.102 | 0.829 |
| MEASURED LOCATION 2 | 0.156 | 0.226 | 1.693 | 1.062 |
| MEASURED LOCATION 3 | 0.137 | 0.189 | 1.307 | 0.878 |
| MEASURED LOCATION 4 | 0.126 | 0.195 | 1.693 | 1.017 |
| MEASURED LOCATION 5 | 0.107 | 0.142 | 0.865 | 0.661 |
| MEASURED LOCATION 6 | 0.128 | 0.177 | 0.996 | 0.861 |

Fig.8

| | EFFECTIVE ELECTRODE AREA ($\mu m^2$) | REFERENCE AREA ($\mu m^2$) | RATIO OF EFFECTIVE ELECTRODE AREA (%) | CONTACT RESISTANCE ($\Omega$) | VARIATION IN CONTACT RESISTANCE $\sigma$ |
|---|---|---|---|---|---|
| COMPARATIVE EXAMPLE 1 | 39923 | 831672 | 4.8 | EXIST OPENING | - |
| COMPARATIVE EXAMPLE 2 | 58859 | 831672 | 7.1 | 93.8 | 12.6 |
| COMPARATIVE EXAMPLE 3 | 73162 | 831672 | 8.8 | 98.4 | 16.3 |

Fig.9

| | EFFECTIVE ELECTRODE AREA (μm²) | REFERENCE AREA (μm²) | RATIO OF EFFECTIVE ELECTRODE AREA (%) | CONTACT RESISTANCE (Ω) | VARIATION IN CONTACT RESISTANCE σ |
|---|---|---|---|---|---|
| EXAMPLE 1 | 91484 | 831672 | 10.1 | 75.6 | 8.6 |
| EXAMPLE 2 | 166334 | 831672 | 20.0 | 61.8 | 9.0 |
| EXAMPLE 3 | 234635 | 831672 | 28.2 | 45.9 | 8.5 |
| EXAMPLE 4 | 309530 | 831672 | 37.2 | 43.4 | 8.6 |
| EXAMPLE 5 | 364313 | 831672 | 43.8 | 45.0 | 6.0 |

ELECTRONIC COMPONENT, PRODUCTION METHOD OF ELECTRONIC COMPONENT, MOUNTED STRUCTURE OF ELECTRONIC COMPONENT, AND EVALUATION METHOD OF ELECTRONIC COMPONENT

BACKGROUND OF THE INVENTION

1. Field of the Invention

The present invention relates to an electronic component, a production method of the electronic component, a mounted structure of the electronic component, and an evaluation method of the electronic component.

2. Related Background Art

There is a known technology for mounting an electronic component of a surface mount type having two terminal electrodes, onto a circuit substrate by means of anisotropic electroconductive film (e.g., cf. Japanese Patent Application Laid-Open No. 9-326326). The anisotropic electroconductive film is an insulating adhesive of a film form in which electroconductive particles are dispersed. The anisotropic electroconductive film is interposed between the circuit substrate and the terminal electrodes of the electronic component, and is then heated and pressed, whereby the circuit substrate and the terminal electrode are electrically connected through spherical electroconductive particles located between the circuit substrate and the terminal electrodes.

SUMMARY OF THE INVENTION

However, when the terminal electrodes of the electronic component are electrically connected through electroconductive particles to the circuit substrate, as described in Japanese Patent Application Laid-Open No. 9-326326, there is variation in connection resistance. The variation in connection resistance increases with increase in the number of terminal electrodes which the electronic component has.

The present invention has been accomplished in order to solve the above problem and an object of the present invention is to provide an electronic component capable of reducing the variation in connection resistance when mounted on a circuit substrate through the use of the electroconductive particles, and a production method of the electronic component. Another object of the present invention is to provide a mounted structure of an electronic component capable of reducing the variation in connection resistance when mounted on a circuit substrate through the use of electroconductive particles.

Incidentally, there was no method for evaluating the connection resistance of electronic components to be mounted on a circuit substrate through the use of electroconductive particles. Therefore, a further object of the present invention is to provide an evaluation method of an electronic component for evaluating the connection resistance when it is mounted on a circuit substrate through the use of electroconductive particles.

The Inventors conducted studies and found that the variation in connection resistance occurred if there was a region where electroconductive particles were not crushed between the terminal electrode and the circuit substrate, so as to cause poor electrical connection in that region. Then the Inventors further conducted studies on a method of crushing the electroconductive particles more securely and accomplished the present invention, based thereon.

An electronic component according to the present invention is an electronic component comprising: an element body having at least one plane; and a terminal electrode formed on the plane of the element body and adapted to be electrically connected through an electroconductive particle to a circuit substrate; wherein when the plane of the element body is defined as a reference plane, a ratio of a projected area onto the reference plane of an external surface of the terminal electrode opposed to the circuit substrate in a region where a height of the terminal electrode from the reference plane is not less than a value resulting from subtraction of a diameter of the electroconductive particle from a maximum of the height, to a projected area onto the reference plane of the external surface of the terminal electrode opposed to the circuit substrate is not less than 10%.

Since in the electronic component of the present invention the ratio of the projected area onto the reference plane of the external surface opposed to the circuit substrate in the foregoing region to the projected area onto the reference plane of the external surface of the terminal electrode opposed to the circuit substrate is not less than 10%, the external surface opposed to the circuit substrate has a flatness corresponding to the diameter of the electroconductive particle. For this reason, the electroconductive particle is more securely crushed between the terminal electrode and the circuit substrate, whereby the terminal electrode is surely electrically connected through the electroconductive particle to the circuit substrate. Therefore, it is feasible to suppress poor electrical connection in mounting using the electroconductive particle, and thereby to reduce the variation in connection resistance.

Preferably, the terminal electrode comprises three or more terminal electrodes, and in at least three terminal electrodes out of the three or more terminal electrodes, the foregoing ratio of the projected area is not less than 10%. In this case, poor electrical connection is prevented in at least three terminal electrodes. This results in reducing the variation in connection resistance.

A production method of an electronic component according to the present invention is a method of producing an electronic component, comprising: a preparation step of preparing an element body having at least one plane; and a forming step of forming a terminal electrode to be electrically connected to a circuit substrate through an electroconductive particle, on the plane of the element body so that when the plane of the element body is defined as a reference plane, a ratio of a projected area onto the reference plane of an external surface of the terminal electrode opposed to the circuit substrate in a region where a height of the terminal electrode from the reference plane is not less than a value resulting from subtraction of a diameter of the electroconductive particle from a maximum of the height, to a projected area onto the reference plane of the external surface of the terminal electrode opposed to the circuit substrate is not less than 10%.

Since in the production method of the electronic component of the present invention the forming step comprises forming the terminal electrode so that the ratio of the projected area onto the reference plane of the external surface opposed to the circuit substrate in the foregoing region, to the projected area onto the reference plane of the external surface of the terminal electrode opposed to the circuit substrate is not less than 10%, the external surface opposed to the circuit substrate has a flatness corresponding to the diameter of the electroconductive particle. For this reason, the electroconductive particle is more securely crushed between the terminal electrode and the circuit substrate, whereby the terminal electrode is surely electrically connected through the electroconductive particle to the circuit substrate. Therefore, it is feasible to prevent poor electrical connection in mounting using the electroconductive particle and thereby to produce the electronic component with reduced variation in the connection resistance.

Preferably, the forming step includes: an applying step of applying an electroconductive paste onto the plane of the element body; a planarizing step of planarizing an external surface of the applied electroconductive paste so that when the plane of the element body is defined as a reference plane, a ratio of a projected area onto the reference plane of the external surface opposed to the circuit substrate in a region where a height of the electroconductive paste from the reference plane is not less than a value resulting from subtraction of a diameter of the electroconductive particle from a maximum of the height, to a projected area onto the reference plane of the external surface of the electroconductive paste opposed to the circuit substrate is not less than 10%; and a baking step of baking the planarized electroconductive paste to form the terminal electrode. Since the external surface of the applied electroconductive paste is planarized during formation of the terminal electrode, the terminal electrode is readily formed with a flatness corresponding to the diameter of the electroconductive particle.

Preferably, the preparation step comprises preparing an element body further having a plane opposed to the aforementioned plane, as the element body; the applying step comprises applying the electroconductive paste onto at least one plane out of the two planes; and the planarizing step comprises pressing the electroconductive paste in directions normal to the reference plane while interposing the electroconductive paste between two metal plates arranged in parallel with the reference plane, thereby planarizing the external surface. Since in the planarizing step the external surface is planarized by pressing the electroconductive paste while interposing the electroconductive paste between the two metal plates arranged in parallel with the reference plane, the external surface is more readily and securely formed with a flatness corresponding to the diameter of the electroconductive particle.

A mounted structure of an electronic component according to the present invention is a mounted structure of an electronic component, comprising: a circuit substrate; and an electronic component comprising an element body having at least one plane, and a terminal electrode formed on the plane of the element body; wherein the terminal electrode is electrically connected through an electroconductive particle to the circuit substrate in a state in which the plane of the element body is opposed to the circuit substrate, and wherein when the plane of the element body is defined as a reference plane, a ratio of a projected area onto the reference plane of an external surface of the terminal electrode opposed to the circuit substrate in a region where a height of the terminal electrode from the reference plane is not less than a value resulting from subtraction of a diameter of the electroconductive particle from a maximum of the height, to a projected area onto the reference plane of the external surface of the terminal electrode opposed to the circuit substrate is not less than 10%.

Since in the mounted structure of the electronic component of the present invention the ratio of the projected area onto the reference plane of the external surface opposed to the circuit substrate in the foregoing region, to the projected area onto the reference plane of the external surface of the terminal electrode opposed to the circuit substrate is not less than 10%, the external surface opposed to the circuit substrate has a flatness corresponding to the diameter of the electroconductive particle. For this reason, the electroconductive particle is more securely crushed between the terminal electrode and the circuit substrate, whereby the terminal electrode is surely electrically connected through the electroconductive particle to the circuit substrate. Therefore, it is feasible to prevent poor electrical connection in mounting using the electroconductive particle, and thereby to mount the electronic component with reduced variation in the connection resistance.

An evaluation method of an electronic component according to the present invention is an evaluation method of evaluating a connection resistance of an electronic component comprising an element body having at least one plane, and a terminal electrode formed on the plane of the element body and adapted to be electrically connected through an electroconductive particle to a circuit substrate, wherein when the plane of the element body is defined as a reference plane, the connection resistance is evaluated based on a ratio of a projected area onto the reference plane of an external surface of the terminal electrode opposed to the circuit substrate in a region where a height of the terminal electrode from the reference plane is not less than a value resulting from subtraction of a diameter of the electroconductive particle from a maximum of the height, to a projected area onto the reference plane of the external surface of the terminal electrode opposed to the circuit substrate.

Since in the evaluation method of the electronic component of the present invention the evaluation of the connection resistance of the electronic component is carried out based on the ratio of the projected area onto the reference plane of the external surface opposed to the circuit substrate in the foregoing region, to the projected area onto the reference plane of the external surface of the terminal electrode opposed to the circuit substrate, the evaluation of the connection resistance of the electronic component can be performed based on a flatness corresponding to the diameter of the electroconductive particle. Namely, when the terminal electrode is connected through the electroconductive particle to the circuit substrate, evaluation can be appropriately carried out, for example, as to how easily the electroconductive particle is crushed. Therefore, the evaluation of the connection resistance in the electronic component can be carried out in mounting using the electroconductive particle.

The present invention successfully provides the electronic component with reduced variation in the connection resistance when mounted through the use of the electroconductive particle on the circuit substrate, and the production method of the electronic component. The invention also provides the mounted structure of the electronic component with reduced variation in the connection resistance when the electronic component is mounted through the use of the electroconductive particle on the circuit substrate. The invention further provides the evaluation method of the electronic component about the connection resistance when the electronic component is mounted through the use of the electroconductive particle on the circuit substrate.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 7 is a table showing surface roughnesses of metal plates.

FIG. 8 is a table showing test results of comparative examples.

FIG. 9 is a table showing test results of examples.

DESCRIPTION OF THE PREFERRED EMBODIMENTS

The best mode for carrying out the present invention will be described below in detail with reference to the accompanying drawings. In the description of the drawings the same elements will be denoted by the same reference symbols, without redundant description.

Figure 1:
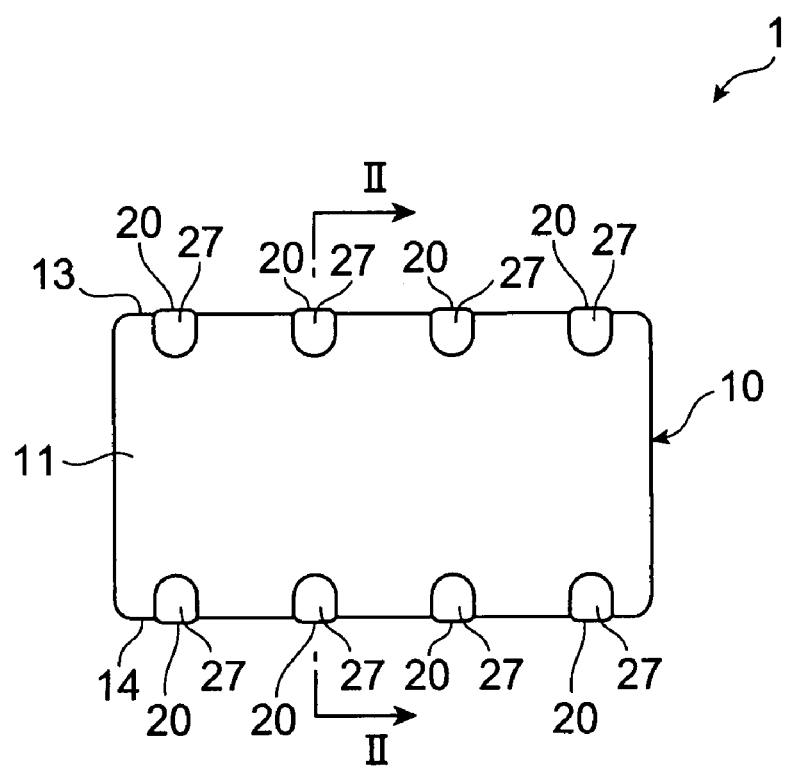
FIG. 1 is a plan view of an electronic component according to an embodiment of the present invention.
Figure 2:
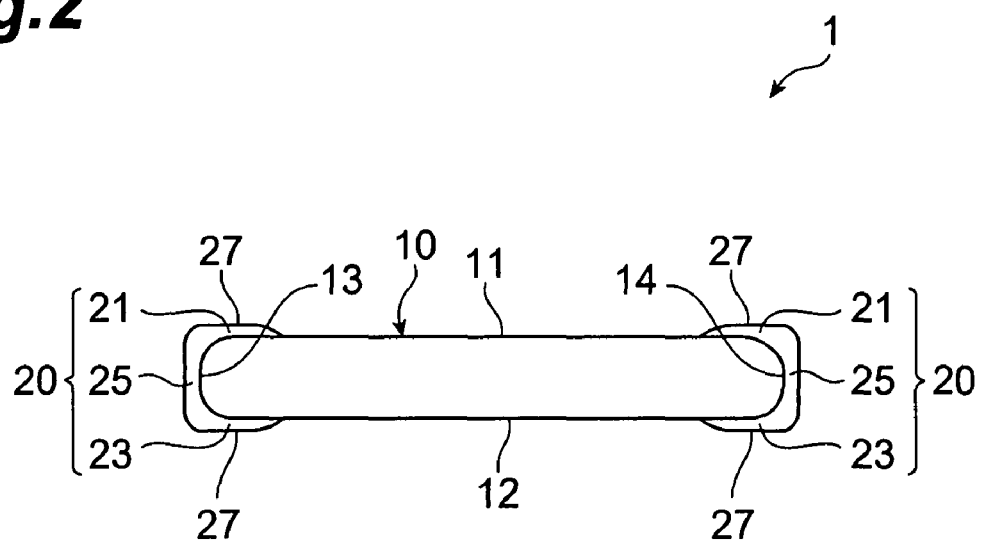
FIG. 2 is a sectional view of the electronic component according to the embodiment.

The below will describe an electronic component and a mounted structure of the electronic component according to an embodiment of the present invention. FIG. 1 is a plan view of the electronic component according to the present embodiment. FIG. 2 is a sectional view of the electronic component according to the present embodiment. The electronic component 1 according to the present embodiment is a component of a surface mount type comprising an element body 10 and a plurality of terminal electrodes 20 (eight terminal electrodes in the present embodiment).

The element body 10 is formed in an approximately rectangular parallelepiped shape and is composed of plane 11 and plane 12 opposed to each other, two end faces arranged perpendicularly to the planes 11 and 12 and opposed to each other, and side face 13 and side face 14 arranged perpendicularly to the planes 11 and 12 and to the two end faces and opposed to each other. The element body 10 has a variety of conductor patterns electrically connected to the terminal electrodes 20 and located inside, and constitutes a capacitor, a coil, or the like. The element body 10 can be formed, for example, by stacking dielectric layers or insulator layers with the conductor patterns printed thereon.

There are four terminal electrodes 20 on the side face 13 side and four terminal electrodes 20 on the side face 14 side. Each terminal electrode 20 has a portion 21 formed on the plane 11, a portion 23 formed on the plane 12, and a portion 25 formed on the side face 13 or on the side face 14 so as to link the portion 21 and the portion 23.

Four portions 21 are arranged in a mutually electrically isolated state along an edge on the side face 13 side on the plane 11. Four portions 21 are arranged in a mutually electrically isolated state along an edge on the side face 14 side on the plane 11. Four portions 23 are arranged in a mutually electrically isolated state along an edge on the side face 13 side on the plane 12. Four portions 23 are arranged in a mutually electrically isolated state along an edge on the side face 14 side on the plane 12.

Four portions 25 are arranged in a mutually electrically isolated state on the side face 13 so as to physically and electrically connect the portions 21 and 23 corresponding to each other. Four portions 25 are arranged in a mutually electrically isolated state on the side face 14 so as to physically and electrically connect the portions 21 and 23 corresponding to each other.

Figure 3:
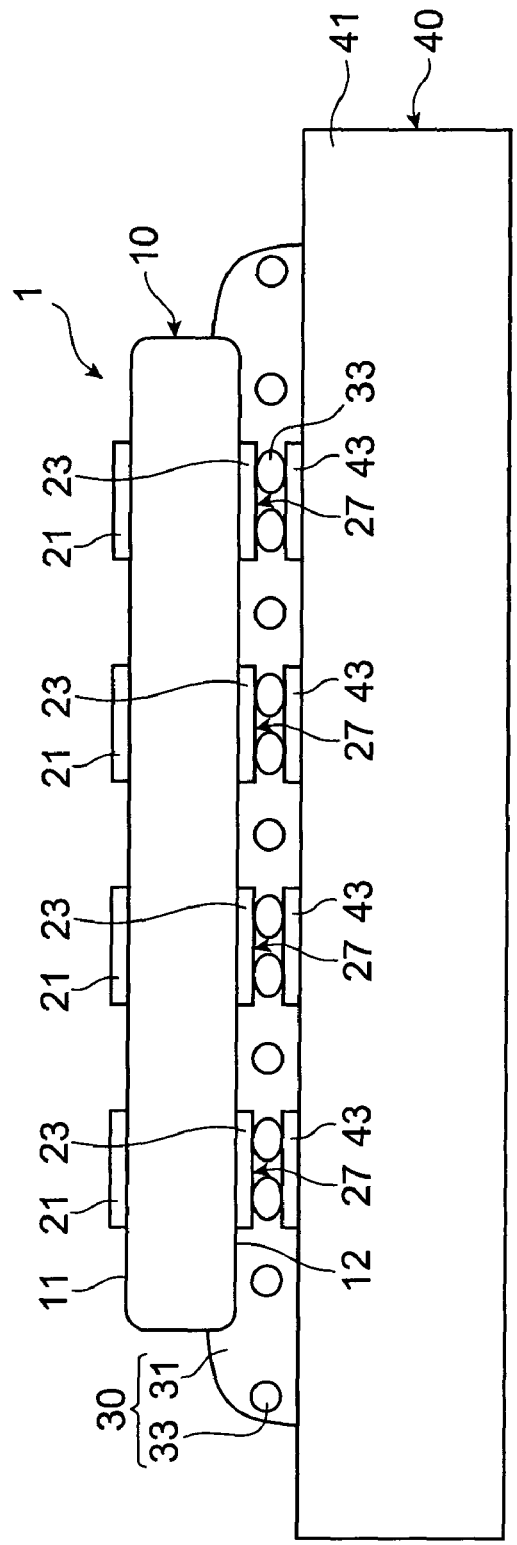
FIG. 3 is a schematic view showing a mounted structure of the electronic component according to the embodiment.

FIG. 3 is a schematic diagram showing a mounted structure of the electronic component according to the present embodiment. The electronic component 1 is mounted on a circuit substrate 40. Specifically, the electronic component 1 is mounted so that external surfaces 27 of the terminal electrodes 20 on either one side (the plane 12 side in the present embodiment) out of the planes 11 and 12 are mounted through anisotropic electroconductive film 30 on the circuit substrate 40. FIG. 3 shows a sectional configuration obtained by cutting the circuit substrate 40 and the electronic component 1 by a plane perpendicular to the planes 11, 12 and parallel to the side faces 13, 14.

The circuit substrate 40 has a base plate 41 and eight land electrodes 43. The eight land electrodes 43 are arranged in two rows on the base plate 41 so as to correspond to the portions 23 of the eight terminal electrodes 20 in the electronic component 1. The land electrodes 43 in one row are physically and electrically connected to the terminal electrodes 20 formed on one side face 13 side of the electronic component 1. The land electrodes 43 in the other row are physically and electrically connected to the terminal electrodes 20 formed on the other side face 14 side of the electronic component 1.

The anisotropic electroconductive film 30 has an adhesive 31 and electroconductive particles 33 dispersed in the adhesive 31. The adhesive 31 is an electrically insulating adhesive formed in a tape form. The adhesive 31 is an epoxy resin. The electroconductive particles 33 are particles of approximately spherical shape obtained by coating approximately spherical particles of a resin with an electroconductive metal such as Ni or Au.

The land electrodes 43 and the external surfaces 27 are connected by heating the anisotropic electroconductive film 30 while interposing it between the land electrodes 43 of the circuit substrate 40 and the external surfaces 27 of the terminal electrodes 20, and by pressing the land electrodes and external surfaces 27 in directions perpendicular to the external surfaces 27 and to the principal surface of the base plate 41. Namely, the land electrodes 43 and external surfaces 27 are bonded with the adhesive 31.

The land electrodes 43 and the external surfaces 27 are bonded in a state in which the electroconductive particles 33 present between the land electrodes 43 and the external surfaces 27 are crushed and sandwiched between the land electrodes 43 and the external surfaces 27. The electroconductive particles 33 are physically and electrically connected to each of land electrode 43 and external surface 27 by virtue of repulsion of the electroconductive particles 33 crushed between the land electrode 43 and the external surface 27, and thereby electrically connect the land electrode 43 to the external surface 27.

Namely, the eight terminal electrodes 20 are electrically connected through the electroconductive particles 33 to the circuit substrate 40 in a state in which the plane 12 of the element body 10 is opposed to the circuit substrate 40. Namely, the external surfaces 27 on the plane 12 side are opposed to the circuit substrate.

Let us define the plane 12 of the element body 10 opposed to the circuit substrate 40, as a reference plane 12. Let an effective electrode region be a region in which height of each terminal electrode 20 from the reference plane 12 is not less than a value resulting from subtraction of the diameter of the electroconductive particles 33 from a maximum of the height. The height of each terminal electrode 20 from the reference plane 12 is a distance from the reference plane 12 to the external surface 27 of the terminal electrode 20 opposed to the circuit substrate in the direction perpendicular to the reference plane 12. Namely, the effective electrode region is a region determined corresponding to the electroconductive particles 33, in the external surface 27.

Let a reference area be a projected area onto the reference plane 12 of the external surfaces 27 of the terminal electrodes 20 opposed to the circuit substrate 40. The reference area is a total area for the eight terminal electrodes 20. Let an effective electrode area be a projected area onto the reference plane 12 of the external surfaces opposed to the circuit substrate 40 in the effective electrode regions. Namely, the effective electrode area is an area of regions determined corresponding to the electroconductive particles 33, in the external surfaces 27. The effective electrode area is a total area of the effective electrode regions for the eight terminal electrodes 20.

In this case, when the reference area is 100%, the ratio of the effective electrode area is not less than 10%. As the ratio of the effective electrode region becomes larger, the electroconductive particles are securely crushed in a larger region. For this reason, the terminal electrodes and the circuit substrate 40 can be electrically connected more reliably.

Since in the electronic component 1 of the present embodiment the ratio of the effective electrode area in the terminal electrodes 20 is not less than 10%, based on the reference area of 100%, the external surfaces 27 opposed to the circuit substrate 40 have a flatness corresponding to the diameter of the electroconductive particles 33. Therefore, the electroconductive particles 33 are more securely crushed between the terminal electrodes 20 and the land electrodes 43, whereby the terminal electrodes 20 are electrically connected more reliably through the electroconductive particles 33 to the circuit substrate 40. Accordingly, poor electrical connection is prevented in mounting using the electroconductive particles 33 and variation is reduced in the connection resistance.

Since in the electronic component 1 of the present embodiment the ratio of the effective electrode area in the eight terminal electrodes 20 is not less than 10%, based on the reference area of 100%, the external surfaces 27 opposed to the circuit substrate 40 have the flatness corresponding to the diameter of the electroconductive particles 33. For this reason, poor electrical connection is prevented in the eight terminal electrodes 20 in mounting using the electroconductive particles 33, and variation is reduced in the connection resistance.

In the electronic component 1 of the present embodiment, it is also preferable that a ratio of a projected area onto the plane 11 in regions where the height of the terminal electrodes 20 from the plane 11 is not less than a value resulting from subtraction of the diameter of the electroconductive particles 33 from the maximum of the height, to a projected area onto the plane 11 of the external surfaces 27 on the plane 11 side be not less than 10%. In this case, the external surfaces 27 on the plane 11 side and the external surfaces 27 on the plane 12 side have the flatness corresponding to the diameter of the electroconductive particles 33. Therefore, the variation in the connection resistance can be reduced in either case where the external surfaces 27 on the plane 11 side or the external surfaces 27 on the plane 12 side are connected to the land electrodes 43.

Since in the mounted structure of the electronic component of the present embodiment the ratio of the effective electrode area in the terminal electrodes 20 is not less than 10%, based on the reference area of 100%, the external surfaces 27 opposed to the circuit substrate 40 have the flatness corresponding to the diameter of the electroconductive particles 33. Therefore, the electroconductive particles 33 are more securely crushed between the terminal electrodes 20 and the land electrodes 43, whereby the terminal electrodes 20 are electrically connected more reliably through the electroconductive particles 33 to the circuit substrate 40. Therefore, poor electrical connection is prevented in mounting using the electroconductive particles 33, and the electronic component 1 can be mounted with reduced variation in the connection resistance.

Figure 4:
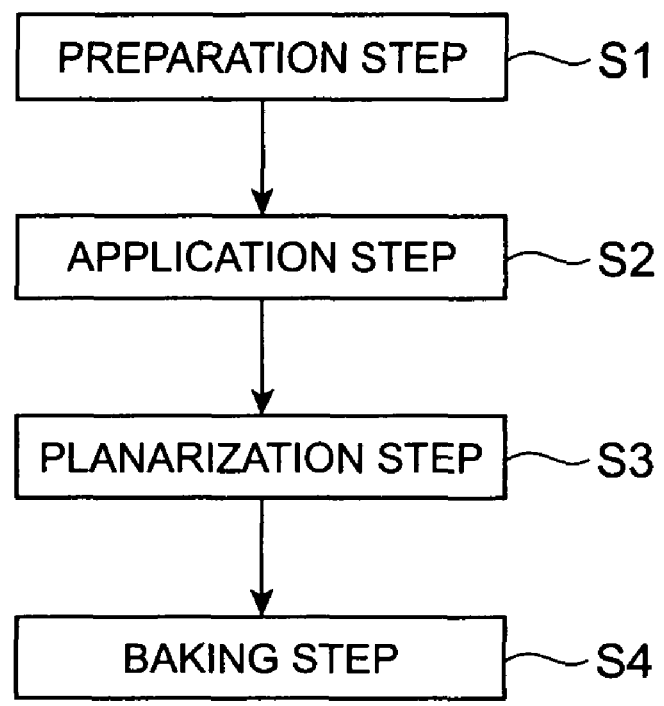
FIG. 4 is a flowchart showing a production method of the electronic component according to the embodiment.
Figure 5:
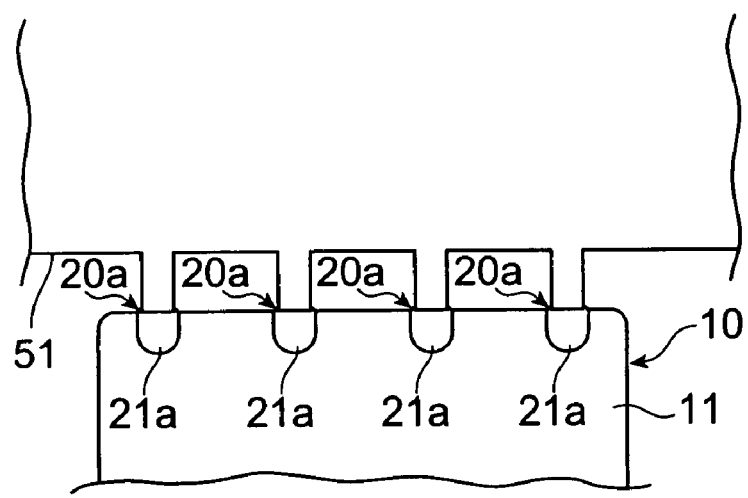
FIG. 5 is a drawing showing a production method of the electronic component according to the embodiment.
Figure 6:
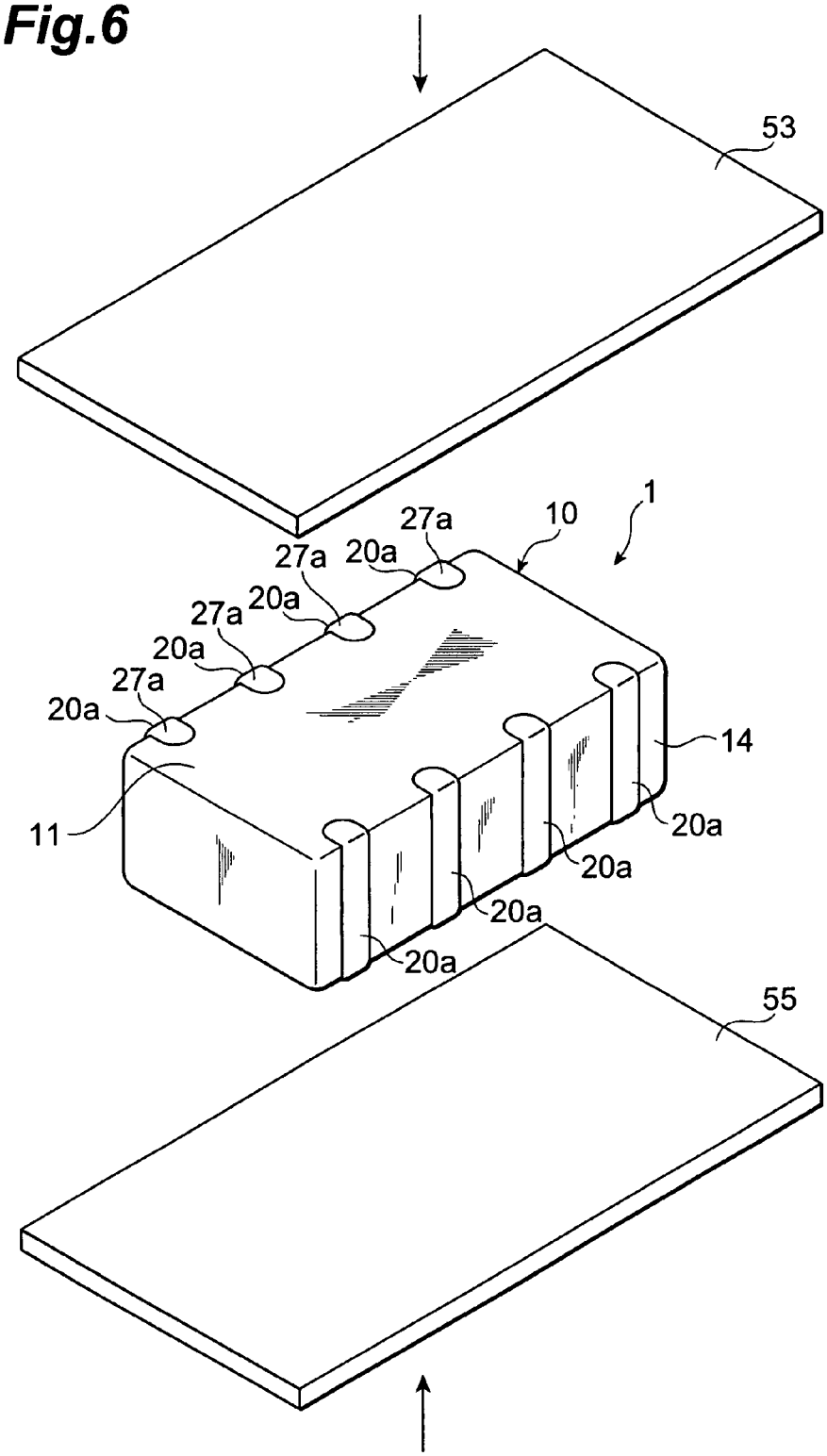
FIG. 6 is a drawing showing a production method of the electronic component according to the embodiment.

The following will describe a production method of the electronic component according to the present embodiment. FIG. 4 is a flowchart showing the production method of the electronic component according to the present embodiment. FIGS. 5 and 6 are drawings showing the production method of the electronic component according to the present embodiment. The production method of the electronic component 1 according to the present embodiment includes a preparation step S1, an application step S2, a planarization step S3, and a baking step S4.

The first preparation step S1 is to prepare the element body 10 of approximately rectangular parallelepiped shape having the planes 11, 12 opposed to each other. For example, the element body 10 including a capacitor can be formed as follows. An organic binder, an organic solvent, etc. are added into a powdered dielectric ceramic material to obtain a slurry. Then this slurry is used to make dielectric ceramic green sheets by a known method such as the doctor blade method. Next, corresponding conductor patterns are formed on the respective dielectric ceramic green sheets. The conductor patterns are formed, for example, by screen-printing a conductor paste consisting primarily of silver and thereafter drying it.

Then an intermediate laminate body is formed by laminating the dielectric ceramic green sheets with the conductor patterns thereon and the dielectric ceramic green sheets without conductor patterns and compressing them. Then the resultant intermediate laminate body is cut in a chip unit, is subjected to removal (debind) of the organic binder, and is fired to obtain the element body 10.

The subsequent application step S2 is to apply an electroconductive paste for the terminal electrodes to desired positions for formation of the terminal electrodes 20 on the planes 11, 12 and the side faces 13, 14 of the element body 10. In this step, as shown in FIG. 5, a transfer member 51 (die) is used to apply the electroconductive paste 20a to positions corresponding to the portions 25 of the terminal electrodes 20 on the opposed side faces 13, 14 of the element body 10. The electroconductive paste for terminal electrodes used herein is, for example, a mixture of an electroconductive metal powder such as Ag, glass frit, an organic binder, and an organic solvent.

The transfer member 51 is provided with a plurality of projections on a side face thereof, and widths and intervals of the respective projections correspond to the portions 25 of the terminal electrodes 20 formed on the side faces 13, 14 of the element body 10. The electroconductive paste for terminal electrodes is applied to the projections of the transfer member 51 and the electroconductive paste is brought into contact with the side faces 13, 14 of the element body 10 to be transferred thereto. At this time, the electroconductive paste 20a transferred flows around edges to the plane 11, 12 sides to form portions 21a and portions 23a corresponding to the portions 21 and the portions 23 of the terminal electrodes 20. Thereafter, the electroconductive paste 20a for terminal electrodes applied is heated and dried (debind).

The subsequent planarization step S3 is, as shown in FIG. 6, to crush and planarize the external surfaces 27a of the electroconductive paste 20a so that the ratio of the effective electrode area is not less than 10%, based on the reference area of 100%. In the planarization step S3, the element body 10 with the electroconductive paste thereon is placed between two metal plates 53, 55 arranged in parallel with the reference plane 12, and they are pressed in the directions perpendicular to the reference plane 12 to crush the external surfaces 27a, thereby planarizing the external surfaces 27a. Namely, the external surfaces 27a are crushed and flattened by the metal plates 53, 55. For example, while the electroconductive paste 20a is heated at about 80° C., the external surfaces 27a are crushed and planarized by the metal plates 53, 55 for 60 minutes.

The next baking step S4 is to bake the planarized electroconductive paste 20a at 500-850° C. to obtain the element body 10 with the terminal electrodes 20.

Since the production method of the electronic component of the present embodiment involves the planarization step S3 to form the external surfaces 27a of the electroconductive paste 20a so that the ratio of the effective electrode area is not less than 10%, based on the reference area of 100%, the external surfaces 27 opposed to the circuit substrate 40, in the terminal electrodes 20 obtained by baking of the electroconductive paste 20a have the flatness corresponding to the diameter of the electroconductive particles 33. Therefore, the electroconductive particles 33 are securely crushed between the terminal electrodes 20 and the land electrodes 43, whereby the terminal electrodes 20 are electrically connected more reliably through the electroconductive particles 33 to the circuit substrate 40. Therefore, poor electrical connection is prevented in mounting using the electroconductive particles 33, and the electronic component 1 can be produced with reduced variation in the connection resistance.

In the production method of the electronic component of the present embodiment, after the application of the electroconductive paste 20a in the application step S2, the planarization step S3 is carried out to planarize the external surfaces 27a of the electroconductive paste 20a. This enables easy formation of the terminal electrodes 20 having the flatness corresponding to the diameter of the electroconductive particles 33.

The production method of the electronic component of the present embodiment involves the planarization step S3 to interpose the element body 10 with the electroconductive paste 20a between the two metal plates 53, 55 arranged in parallel with the reference plane 12 and to press the element body 10, thereby crushing the external surfaces 27a of the electroconductive paste 20a. This permits us to more readily and securely form the external surfaces 27a having the flatness corresponding to the diameter of the electroconductive particles 33. It also enables simultaneous planarization of the external surfaces 27a on the plane 11 side and the external surfaces 27a on the plane 12 side.

The following will describe an evaluation method of an electronic component according to the present embodiment. The evaluation method of the electronic component according to the present embodiment is an evaluation method of an electronic component about the connection resistance in the case where the electronic component is mounted on the circuit substrate 40 through the use of the anisotropic electroconductive film 30.

The electronic component as an object of the evaluation method of the electronic component according to the present embodiment comprises an element body of an approximately rectangular parallelepiped shape having planes opposed to each other, and eight terminal electrodes formed on the element body. The element body has two side faces adjoining the two mutually opposed planes and opposed to each other. The eight terminal electrodes include four terminal electrodes formed on one of the two side faces, and four terminal electrodes formed on the other side face. Each terminal electrode includes a portion formed on one plane, a portion formed on the other plane, and a portion formed on a side face.

In the evaluation method of the electronic component according to the present embodiment, objects of evaluation are external surfaces of the eight terminal electrodes. The external surfaces of the eight terminal electrodes are surfaces of the terminal electrodes to be electrically connected to the circuit substrate 40 through the use of the anisotropic electroconductive film 30. Namely, the external surfaces are surfaces of the terminal electrodes opposed to the circuit substrate.

The plane of the element body opposed to the circuit substrate is defined as a reference plane. Let an effective electrode region be a region in which a height of each terminal electrode from the reference plane is not less than a value resulting from subtraction of the diameter of the electroconductive particles 33 from a maximum of the height. The height of each terminal electrode from the reference plane is a distance from the reference plane to the external surface of the terminal electrode opposed to the circuit substrate 40 in the direction perpendicular to the reference plane.

Let a reference area be a projected area onto the reference plane of the external surfaces of the terminal electrodes opposed to the circuit substrate 40. Let an effective electrode area be a projected area onto the reference plane of the external surfaces opposed to the circuit substrate 40 in the effective electrode regions. In this case, the evaluation method of the electronic component according to the present embodiment is carried out based on a ratio of the effective electrode area with respect to the reference area of 100%.

A specific example of the evaluation method of the electronic component according to the present embodiment will be described below. For example, a laser microscope (VK8510 available from KEYENCE CORPORATION) is used to obtain data of heights on the basis of the corresponding reference plane for each external surface as an evaluation object. The subsequent step is to draw the effective electrode regions where the height is not less than the value resulting from the subtraction of the diameter of the electroconductive particles 33 from the maximum of the height, in each external surface as an evaluation object. The next step is to count the total number of pixels in an image file of the effective electrode regions for each external surface thus drawn.

All the external surfaces as evaluation objects are drawn, and the total number of pixels is counted in an image file resulting from the drawing of all the external surfaces. The ratio of the effective electrode area is a ratio of the total pixel number in the image file of the effective electrode regions, to the total pixel number in the image file of all the external surfaces as 100%. The connection resistance of the electronic component is evaluated based on the ratio of the effective electrode area calculated in this way. For example, when the ratio of the effective electrode area is not less than 10%, the quality of the electronic component is evaluated as good for variation in the connection resistance.

Since the evaluation method of the electronic component of the present embodiment is arranged to evaluate the electronic component on the basis of the ratio of the effective electrode area with respect to the reference area of 100% in the terminal electrodes 20, the quality of the electronic component can be evaluated based on the flatness corresponding to the diameter of the electroconductive particles 33. Namely, evaluation can be appropriately carried out, for example, as to how easily the electroconductive particles 33 are crushed, on the occasion when the terminal electrodes are bonded through the electroconductive particles 33 to the circuit substrate 40. Therefore, the evaluation of the electronic component can be carried out for variation in the connection resistance in mounting using the electroconductive particles 33.

Incidentally, it is also contemplated that evaluation of the terminal electrodes is carried out based on a parameter concerning surface roughness of the external surfaces. However, even if the parameter concerning surface roughness indicates "flatter," variation in the connection resistance can be large if the ratio of the effective electrode area is small. Namely, the variation in the connection resistance is greatly affected by the ratio of the effective electrode area corresponding to the electroconductive particles. Therefore, when the evaluation method of the electronic component of the present embodiment is used as described above, the evaluation of the terminal electrodes can be appropriately carried out for the variation in the connection resistance.

The following will describe the test results of comparison between variation in the connection resistance in mounting of the electronic components of the present embodiment and variation in the connection resistance in mounting of conventional electronic components. The electronic components according to the present embodiment were fabricated according to the production method of the present embodiment. The electronic components according to the present embodiment were mounted by applying the mounted structure of the electronic component according to the present embodiment.

First, let us describe electronic components E1-E3 being samples of the conventional electronic components, and electronic components E4-E8 being samples of the electronic components according to the present embodiment. The electronic components E1-E3 are formed by the preparation step S1, application step S2, and baking step S4 described above. The electronic components E4-E8 are formed by the preparation step S1, application step S2, planarization step S3, and baking step S4 described above. Namely, the electronic components E1-E3 are not subjected to the planarization step S3.

Each of the electronic component E1-E8 comprises an element body of an approximately rectangular parallelepiped shape having planes opposed to each other, and eight terminal electrodes formed on the element body. The element body has two planes opposed to each other, and two side faces adjoining the two planes and opposed to each other. The eight terminal electrodes include four terminal electrodes formed on one of the two side faces, and four terminal electrodes formed on the other side face. Each terminal electrode includes a portion formed on one plane, a portion formed on the other plane, and a portion formed on a side face.

An external surface of each terminal electrode is electrically connected to the circuit substrate 40 through the use of anisotropic electroconductive film 30. Namely, the external surface is a surface of a portion formed on one plane, opposed to the circuit substrate, in a terminal electrode.

The electronic components E4-E8 are subjected to the planarization step S3 to planarize the external surfaces so that the ratio of the effective electrode area is not less than 10%, based on the reference area of 100%. In the present examples, the metal plates 53, 55 were stainless-steel plates. FIG. 7 shows data of surface roughnesses of the metal plates 53, 55 used in the present examples. FIG. 7 shows arithmetic mean height Ra, root-mean-square height Rq, maximum sectional height Rt, and 10-point average roughness Rz (JIS) for each of measured locations 1-6 on surfaces of the metal plates 53, 55. The arithmetic mean height Ra, root-mean-square height Rq, maximum sectional height Rt, and 10-point average roughness Rz (JIS) were measured according to JIS B0601 in 2001.

Each of the electronic components E1-E8 fabricated as described above is mounted through the use of anisotropic electroconductive film 30 onto a sample of a circuit substrate. Each circuit substrate sample has an evaluation base plate, eight land electrodes formed on the evaluation base plate and corresponding to the eight terminal electrodes of the electronic components E1-E8, and wires connected to the eight land electrodes, respectively. The evaluation base plate is a glass substrate in the thickness of 0.7 mm obtained by sputtering of ITO (indium tin oxide) with the sheet resistance of $10\Omega$. The wiring patterns were formed so that all the patterns had the same wiring resistance. The diameter of the electroconductive particles in the anisotropic electroconductive film used in the present examples is approximately 4 $\mu$m.

FIG. 8 is a table showing the test results of the comparative examples. FIG. 9 is a table showing the test results of the examples. FIGS. 8 and 9 show the effective electrode area, the reference area, the ratio of the effective electrode area, the contact resistance, and the variation in contact resistance, for each of the electronic components E1-E3 of the comparative examples and the electronic components E4-E8 of the examples.

The effective electrode area is a total area of effective electrode regions in the external surfaces of the eight terminal electrodes opposed to the circuit substrate. The effective electrode area was calculated as follows. First, data of heights was obtained based on the plane of the element body opposed to the circuit substrate, from the eight external surfaces opposed to the circuit substrate, with a laser microscope (VK8510 available from KEYENCE CORPORATION). Then drawn were the effective electrode regions in which the height was not less than the value resulting from subtraction of the diameter 4 $\mu$m of the electroconductive particles 33 from the maximum of the obtained height data. Then the total pixel number in the image file of the drawn effective electrode regions was counted. Then the effective electrode area was calculated based on the counted pixel number.

The reference area is a projected area onto the plane of the element body opposed to the circuit substrate, of the external surfaces of the eight terminal electrodes opposed to the circuit substrate. The reference area is calculated by drawing the entire external surfaces of the eight terminal electrodes opposed to the circuit substrate, with the laser microscope and counting the pixel number in the drawn image file.

The ratio of the effective electrode area is an effective electrode area based on the reference area of 100%. The contact resistance is an average of contact resistances between each of the terminal electrodes 20 in the electronic component and wires. The variation in contact resistance is variation in contact resistances at the eight terminal electrodes 20 in the electronic component.

From FIGS. 8 and 9, the ratio of the effective electrode area is smaller than 10% in each of the electronic components E1-E3 of Comparative Examples 1-3, whereas the ratio of the effective electrode area is not less than 10% in each of the electronic components E4-E8 of Examples 1-5. The variation in contact resistance in the electronic components E4-E8 of Examples 1-5 is more suppressed than the variation in contact resistance in the electronic components E1-E3 of Comparative Examples 1-3.

It was thus confirmed that the variation in connection resistance was reduced between the terminal electrodes and the circuit substrate when the ratio of the effective electrode area relative to the reference area was not less than 10%. It was also confirmed that the variation in connection resistance was reduced between the terminal electrodes and the circuit substrate by applying the production method of the electronic component according to the present embodiment. It was also confirmed that the variation in connection resistance was reduced between the terminal electrodes and the circuit substrate by applying the mounted structure of the electronic component according to the present embodiment.

It is seen from FIGS. 8 and 9 that the variation in connection resistance is relatively small between the terminal electrodes and the circuit substrate when the ratio of the effective electrode area is large. Therefore, it was confirmed that the variation in connection resistance of the electronic component was effectively evaluated based on the ratio of the effective electrode area.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method of producing an electronic component, comprising:
    a preparation step of preparing an element body having at least one plane; and
    a forming step of forming a terminal electrode to be electrically connected to a circuit substrate through an electroconductive particle, on the plane of the element body so that when the plane of the element body is defined as a reference plane, a ratio of a projected area onto the reference plane of an external surface of the terminal electrode opposed to the circuit substrate in a region where a height of the terminal electrode from the reference plane is not less than a value resulting from subtraction of a diameter of the electroconductive particle from a maximum of the height, to a projected area onto the reference plane of the external surface of the terminal electrode opposed to the circuit substrate is not less than 10%;
wherein said forming step includes:
    an applying step of applying an electroconductive paste onto the plane of the element body;
    a planarizing step of planarizing an external surface of the applied electroconductive paste so that when the plane of the element body is defined as a reference plane, a ratio of a projected area onto the reference plane of the external surface opposed to the circuit substrate in a region where a height of the electroconductive paste from the reference plane is not less than a value resulting from subtraction of a diameter of the electroconductive particle from a maximum of the height, to a projected area onto the reference plane of the external surface of the electroconductive paste opposed to the circuit substrate is not less than 10%; and
    a baking step of baking the electroconductive paste planarized,
wherein the preparation step comprises preparing an element body further having a plane opposed to said plane, as the element body,
wherein the applying step comprises applying the electroconductive paste onto at least one plane out of said two planes, and
wherein the planarizing step comprises pressing the electroconductive paste in directions normal to the reference plane while interposing the electroconductive paste between two metal plates arranged in parallel with the reference plane, thereby planarizing the external surface.

* * * * *